United States Patent [19]
Yishay et al.

[11] Patent Number: 5,704,039
[45] Date of Patent: Dec. 30, 1997

[54] MASK PROGRAMMABLE SECURITY SYSTEM FOR A DATA PROCESSOR AND METHOD THEREFOR

[75] Inventors: Oded Yishay; William P. LaViolette; Daniel W. Pechonis, all of Austin, Tex.

[73] Assignee: Motorola, Inc., Schaumburg, Ill.

[21] Appl. No.: 632,179

[22] Filed: Apr. 15, 1996

Related U.S. Application Data

[63] Continuation of Ser. No. 279,378, Jul. 25, 1994, abandoned.

[51] Int. Cl.[6] .................................................. G06F 11/00
[52] U.S. Cl. ........................ 395/186; 380/4; 364/246.7; 364/969.1
[58] Field of Search ........................ 395/575, 186, 395/188.01, 187.01; 380/3, 4, 23, 24, 25; 364/246.6, 246.7, 969, 969.1, 969.2

[56] References Cited

U.S. PATENT DOCUMENTS

| | | | |
|---|---|---|---|
| 4,523,271 | 6/1985 | Levien | 364/200 |
| 4,531,023 | 7/1985 | Levine | 364/918.7 |
| 4,590,552 | 5/1986 | Guttag et al. | 364/200 |
| 4,849,927 | 7/1989 | Vos | 364/964 |
| 4,975,870 | 12/1990 | Knicely et al. | 364/900 |
| 5,014,191 | 5/1991 | Padgaonkar et al. | 364/200 |
| 5,056,009 | 10/1991 | Mizuta | 364/200 |
| 5,067,077 | 11/1991 | Wakimoto et al. | 395/400 |
| 5,247,577 | 9/1993 | Bailey et al. | 380/23 |
| 5,251,304 | 10/1993 | Sibigtroth et al. | 395/375 |
| 5,282,247 | 1/1994 | McLean et al. | 380/4 |
| 5,313,520 | 5/1994 | Han | 380/4 |
| 5,377,343 | 12/1994 | Yaczawa | 380/3 |

FOREIGN PATENT DOCUMENTS

| | | | |
|---|---|---|---|
| 0184397A2 | 11/1986 | European Pat. Off. | G06F 12/14 |
| 2205667 | 12/1988 | United Kingdom | G06F 12/14 |

*Primary Examiner*—Robert W. Beausoliel, Jr.
*Assistant Examiner*—Trinh L. Tu

[57] ABSTRACT

A data processing system (10) allows an authorized user to unlock a security mode by providing a code stored in a plurality of mask registers (60,62,66) such that the system is selectively allowed to communicate with an external device. When an reset signal is received, a selector (48) selects a first mask register (60) and retrieves a first stored address value and a first stored data value therefrom. The first stored address and data values are respectively compared with a first address value and a first data value by a comparator (44). This process of selecting and comparing continues until a final match signal is asserted. When the final match signal is asserted, a secure signal is negated and the system may communicate with the external user.

2 Claims, 3 Drawing Sheets

MASK PROGRAMMABLE SECURITY SYSTEM FOR A DATA PROCESSOR AND METHOD THEREFOR

This application is a continuation of prior patent application No. 08/279,378 filed Jul. 25, 1994, now abandoned.

FIELD OF THE INVENTION

This invention relates generally to a mask option register, and more particularly to a mask option register in a data processor.

BACKGROUND OF THE INVENTION

Many microcontrollers have non-volatile memory embedded in the silicon implementation of the chip. This memory may be, but is not limited to, a ROM, an EEPROM, or a flash EPROM. Typically, the memory stores confidential proprietary software code, including a program code, operating parameters, and other highly sensitive and valuable information. An original equipment manufacturer who uses the microcontroller in a data processing system may have substantial time and money invested in developing this software, and will want to restrict unauthorized access to it. For this reason, a restricted, or "secured" mode is needed to protect unauthorized access to such valuable stored information. Additionally, the original equipment manufacturer must be able to easily disable the secured mode in order to debug the program in the data processing system. As well, a microcontroller manufacturer must also have an easy method to disable the secured mode to test the microcontroller before providing it to the original equipment manufacturer. Therefore, a method for disabling the secured mode must be easy enough to allow for debugging and testing, but still be complex enough that an unauthorized user will not be able to "break" the code in a short period of time.

Prior art implementations of microcontrollers and other types of data processors generally program the software code in an internal non-volatile memory. After a reset signal is asserted, the software code always instructs a central processing unit (CPU) of the microcontroller or data processor to read the states of several external pins. The external pins which are read usually form a data port. The CPU subsequently compares the value read from the external pins forming the data port to several predefined key bytes from the internal non-volatile storage. If the data read from the external pins does not match the key bytes, the procedure is terminated and the microcontroller remains secure. However, if the data matches the key bytes, the CPU repeats the comparison procedure a predefined number of times and terminates if any data does not match the key bytes. In this type of implementation, external logic is needed to provide data to the external pins in predefined time intervals which are synchronous with the multiple read operations executed by the CPU. The comparison procedure is complete, and the secure mode is disabled if all of the data read from the external pins sequentially matches all the predefined key bytes. Once the sequence is completed, the microcontroller enters a test mode, where the internal non-volatile memory is accessible by the CPU or some other device.

While the prior art method described above adequately protects information stored in a memory of the microcontroller, the method is software oriented and requires external logic to provide data to the external pins in a synchronous manner to the CPU reads. Furthermore, this method may only be used with microcontrollers in which the internal memory storing the software code is only accessed by the internal CPU of the microcontroller.

Other microcontrollers support a "slave" mode of operation, wherein memory and registers internal to the microcontroller may be accessed by external logic or external CPU's. The method described above will not support a slave mode of operation because the CPU must be used for ensuring the security of the device and the CPU is disabled during the slave mode of operation on most data processing systems. Other microcontrollers, which support a slave mode of operation, may use internal EEPROM memory as a non-volatile memory. To restrict access to this memory, an additional EEPROM bit is generally required. This EEPROM bit is set during the process of programming the internal EEPROM. When set, external slave mode access to the EEPROM memory is restricted and the information stored therein may not be accessed by an external user. Furthermore, the EEPROM bit may only be cleared when the entire EEPROM contents are erased. In this type of protection system, once the EEPROM bit is set, the EEPROM memory can not be read, even for debugging purposes. Therefore, this system does not allow testing to determine if the code stored in the EEPROM memory was properly written.

Additionally, this method is not suitable to avoid unauthorized access to ROM type memory storage. Even if an EEPROM bit was provided for securing a ROM type memory, the method described above would not be able to provide any protection because, unlike the EEPROM memory, the ROM memory may not be erased when the bit is cleared. The ROM memory is a read only memory and may not be erased so as to provide security during a slave mode of operation.

In light of the prior art described herein, a security method is desired which would selectively allow information to be easily accessed from an internal memory of a data processor while that data processor is supporting a slave mode of operation or a debug mode of operation. Debugging data processors for testing purposes requires a security method which adequately protects software stored internally within a data processor while providing a flexible and facile interface with an external device.

SUMMARY OF THE INVENTION

The previously mentioned needs are fulfilled with the present invention. Accordingly, there is provided, a data processing system which includes a bus interface circuit for communicating a plurality of signals. A control circuit is connected to the bus interface circuit for receiving a first one of the plurality of signals. The control circuit has a first output for selectively providing a control signal in a first logic state in response to the first one of the plurality of signals and a second output for providing a secure signal. A first mask register stores a first stored value. The first mask register provides the first stored value when the control signal is a first value. A comparator is connected to the first mask register for receiving the first stored value. The comparator is connected to the bus interface for receiving a second one of the plurality of signals. The comparator provides a first match signal in a second logic state when the first stored value corresponds to the second one of the plurality of signals. An external bus circuit is connected to the control circuit for receiving the secure signal. The external bus circuit allows communication between the data processing system and an external device when the first match signal is in the second logic state and the secure signal is in the first logic state.

In a second embodiment of the present invention, there is provided a method for providing security for a data processor. The method includes the steps of:

i. receiving a plurality of signals using a bus interface circuit;

ii. retrieving a first stored address value from a first one of a plurality of mask registers;

iii. retrieving a first stored data value from the first one of the plurality of mask registers;

iv. comparing the first stored address value with a first address value of the plurality of signals;

v. comparing the first stored data value with a first data value of the plurality of signals;

vi. asserting a first match signal when the first stored address value is equal to the first address value of the plurality of signals and when the first stored data value is equal to the first data value of the plurality of signals;

vii. executing step ii. when one of the first stored address value is not equal to the first address value of the plurality of signals and the first stored data value is not equal to the first data value of the plurality of signals; and viii. negating a secure signal when the first match signal is asserted.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

Figure 1:
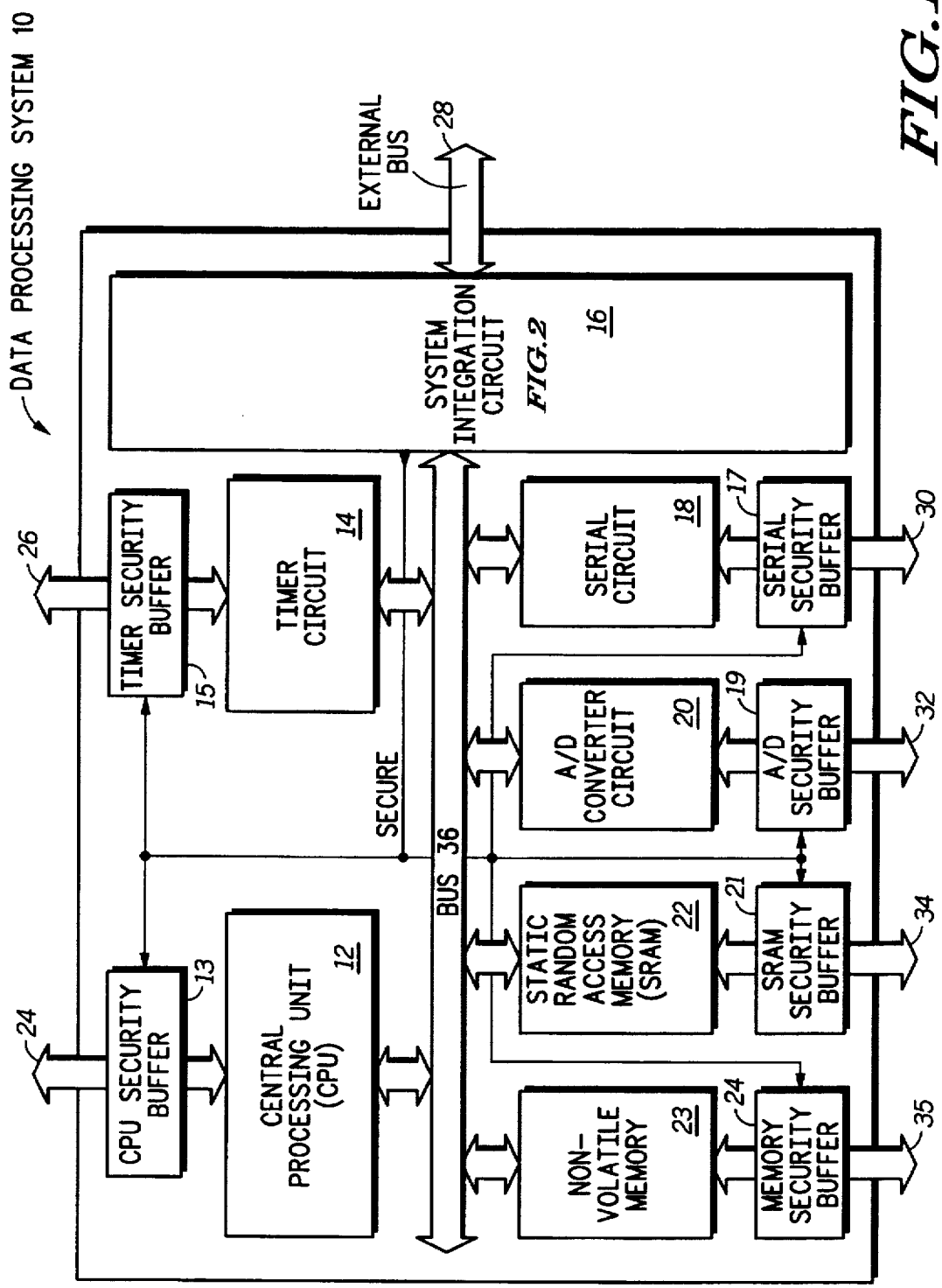
FIG. 1 illustrates in block diagram form a data processing system implementing the present invention.

The present invention provides a security feature for the internal memory of a data processor and a circuit for disabling the security feature. When a security mode of a data processor is enabled, all external reads of internal memory and registers by an external user or an external data processor are disabled. The security mode is accomplished by executing the following actions:

1) Disabling the data processor's ability to allow read operations by an external user or device when the data processor is in a slave mode of operation;

2) Forcing a CPU of the data processor to begin executing instructions from an internal "boot" memory which is a non-volatile memory;

3) Disabling a background debug mode of operation or another debug mode of operation of the data processor; and 4) Disabling the data processor's ability to indicate internal activities to an external user or an external device ("show" cycles).

Each of these four requirements must be met before the data processor may be placed in a secure mode of operation in the present embodiment of the invention. The data processor's ability to operate in slave mode is disabled because reading an internal memory and internal registers by an external logic circuit or an external CPU must be prevented to adequately protect the information stored internally within the data processor. Furthermore, initializing and operating the CPU of the data processor from internal memories, such as a boot ROM or other non-volatile storage, provides a method to prevent the CPU of the data processor from transferring the contents of the internal memories to external destinations. When the data processor enters the background debug mode, the normal instruction flow of the data processor's CPU is interrupted. The data processor's CPU may then be given instructions through one or a plurality of dedicated signals. These dedicated signals may include instructions to read internal registers, to read internal memories and to transfer the data externally through the one or the plurality of dedicated signal lines. Therefore, the background debug mode is disabled when the data processor is to be placed in the secure mode of operation. It should be understood that any debug interface which directly accesses the CPU must be disabled. In the present embodiment of the invention, the background debug mode is disabled, but in alternate embodiments of the invention, any debug mode must be disabled. Show cycles provide an indication of the data processor's internal activity and internal data to an external user or data processor. Because this internal activity and data may include the contents of a protected portion of non-volatile memories of the data processor, show cycles are disabled.

Often, however, the security mode of the data processor must be disabled for testing purposes, debugging purposes, and other authorized access. In the present embodiment of the invention, the security mode of the data processor is disabled by writing a sequence of M data words to a specific sequence of M addresses when the data processor is operating in either a slave or a master mode of operation. These data words and addresses must match a plurality of key word values stored in a plurality of mask-programmable registers. An unlocking sequence will fail to disable the security mode if:

1) The data words and the addresses to which they are written do not match the mask-programmed key words;

2) The next write operation does not match the next data and address value specified in the mask programmable keywords; or 3) A write operation to any other internal register of the data processor occurs between the sequence of write operations in the sequence described above.

When the data processors security mode of operation is disabled, selected accesses to internal resources by external devices are allowed. Furthermore, once the security mode of operation is disabled, the data processor will operate in an unprotected mode until power is removed or a reset signal is asserted.

In the implementation of the invention described herein, it would require an average of more than 10,000 years to break the security code if the write operations are performed at a fastest possible speed. It should be noted that the time given above is based on a system in which a data and address size are both eight bits, the sequence is repeated four times, and the fastest possible speed for performing the write operation is 50 nanoseconds. This time period is calculated based on the assumption that the average time required to break the security code is equal to a number of permutations divided by two times the frequency of operation. The number of permutations is equal to:

$$2^{N*(\text{Number of address bits}+\text{Number of data bits})},$$

where N is equal to a number of time the sequence repeats.

In prior art implementations of security methods, a first data processor implementation may have an internal program code which reads data from a plurality of external pins such as a parallel port and compares the data to a plurality of key bytes provided by an internal ROM (read only memory) or another known volatile memory such as a EEPROM. The parallel port is accessed in predefined time intervals which require both internal and external synchronization. When this security sequence completed, the first data processor enters a test mode in which the internal registers may be accessed. As previously mentioned, this first implementation is a software oriented method and generally requires additional resources to synchronize the data read from the internal ROM or another nonvolatile memory to the data read from the parallel port. As previously mentioned, this prior art implementation would only function when the data processor used therein did not support a slave mode of operation. This restriction was required because if a bit for securing memory in the internal memory of the data processor was included in an address map and could be directly written by an external device when the data processor was in a slave mode of operation, then the secure mode of operation was disabled.

Other prior art implementations use a non-volatile memory bit, such as an EEPROM bit or an EPROM bit, to restrict access to an internal non-volatile memory. Once the non-volatile memory bit is set, the internal contents of the non-volatile memory can not be read externally until the entire non-volatile memory is erased. While this method does not require an excessive amount of additional circuitry or data processing resources, this method does not allow testing of the non-volatile memory after the non-volatile memory bit is set. Additionally, this method is not suitable to avoid unauthorized access by an external user or device to a system with a read only memory (ROM) type storage, because the non-volatile memory bit must be written at some point in time. Therefore, this second prior art implementation may not be flexibly applied to many types of memory systems.

In contrast, the data processing system and method disclosed in the present invention do not require any special external logic circuits to provide data on external pins for unlocking a data processor operating in a secured mode. Additionally, the ability of the present invention to function without external synchronization circuits also eliminates a need for complicated synchronization of the internal activity of the data processor to the activity of the external logic circuits.

The present invention provides a system and method by which only an authorized user may unlock the security code on a data processor, even if the data processor supports slave mode. The present invention is able to support a slave mode of operation because a dedicated hardware circuit and a method of operation are jointly implemented such that an external user may not directly access certain portions of internal memory even when the data processor is operating in the slave mode of operation. This is a feature not found in other prior art solutions as they did not support slave mode. Furthermore, the data processor and method described herein may be used with any type memory, including a ROM type memory, because the data processor and method does not require a writable non-volatile memory bit, as in the prior art implementations. The system and method described herein also allows unlocking the data processor for testing and debugging purposes. Furthermore, although the present system and method described herein provides a very complex obstacle to access by unauthorized users, the system and method may be easily disabled for authorized users and is easily implemented on silicon.

The present invention performs each of the functions described above by providing a method to secure internal data in an internal memory, while allowing access by an authorized user. An unlocking code, or a sequence, to disable a secured mode of operation, is designed to avoid access by an unauthorized user by utilizing a very large number of possible combinations. If, however, an authorized user knows the unlocking sequence, access for testing and debugging purposes is easily provided.

In the implementation of the invention described herein, an attempt to unlock the secured mode by randomly generating an "opening sequence", or by trying all possible combinations, will take an average of more than 10,000 years, at a fastest possible computing speed. Additionally, this invention provides a method to adjust a number of possible combinations to provide added security. In a first embodiment, the present invention may be implemented with a single mask programmable ROM memory layer which easily and cost-effectively provides a different unlocking sequence to disable the security mode in a data processor for various users.

During a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state. It should also be noted that a "$" preceding a value indicates that the value is hexadecimal.

Description of Connectivity

FIG. 1 illustrates a data processing system 10. Data processing system 10 includes a central processing unit, CPU 12, a CPU security buffer 13, a timer circuit 14, a timer security buffer 15, a system integration circuit 16, a serial security buffer 17, a serial circuit 18, an A/D security buffer 19, an A/D converter 20, a SRAM security buffer 21, a static random access memory (SRAM) 22, a non-volatile memory 23, and a memory security buffer 24. Each of CPU 12, timer circuit 14, system integration circuit 16, serial circuit 18, A/D converter 20, static random access memory (SRAM) 22, and non-volatile memory 23 is bidirectionally coupled to bus 36. CPU 12 is coupled to CPU security buffer 13. CPU security buffer 13 is optionally coupled to a device (not shown) external to data processing system 10 by way of integrated circuit terminals 24. CPU security buffer 13 is also coupled to system integration circuit 16 to receive a Secure signal. Timer 14 is coupled to timer security buffer 15. Timer security buffer 15 is coupled to a device (not shown) external to data processing system 10 by way of integrated circuit terminals 26. Timer 14 is also coupled to system integration circuit 16 to receive the Secure signal. System integration circuit 16 is coupled external to data processing system 10 by way of integrated circuit terminals 28. Serial circuit 18 is coupled to serial security buffer 17. Serial security buffer 17 is coupled to a device (not shown) external to data processing system 10 via integrated circuit terminals 30. Serial security buffer 17 is also coupled to system integration circuit 16 to receive the Secure signal. A/D converter 20 is coupled to A/D security buffer 19. A/D security buffer 19 is coupled to a device (not shown) external to data processing system 10 via integrated circuit terminals 32. A/D security buffer 19 is also coupled to system integration circuit 16 to receive the Secure signal. SRAM 22 is coupled to SRAM security buffer 21. SRAM security buffer 21 is coupled to a device (not shown) external to data processing system 10 via integrated circuit terminals 34. SRAM security buffer 21 is also coupled to system integration circuit 16 to receive the Secure signal. Non-volatile memory is coupled to memory security buffer 24. Memory security buffer 24 is coupled to a device (not shown) external to data processing system 10 via integrated circuit terminals 35. Memory security buffer 24 is also coupled to system integration circuit 16 to receive the Secure signal.

In one embodiment of the present invention, data processing system 10 is a microcomputer formed on a single integrated circuit. In one embodiment of the invention, integrated circuit terminals 24, 26, 28, 30, 32, 34, and 35 are integrated circuit bonding pads. In another embodiment of the present invention, integrated circuit terminals 24, 26, 28, 30, 32, 34, and 35 are integrated circuit pins.

Figure 2:
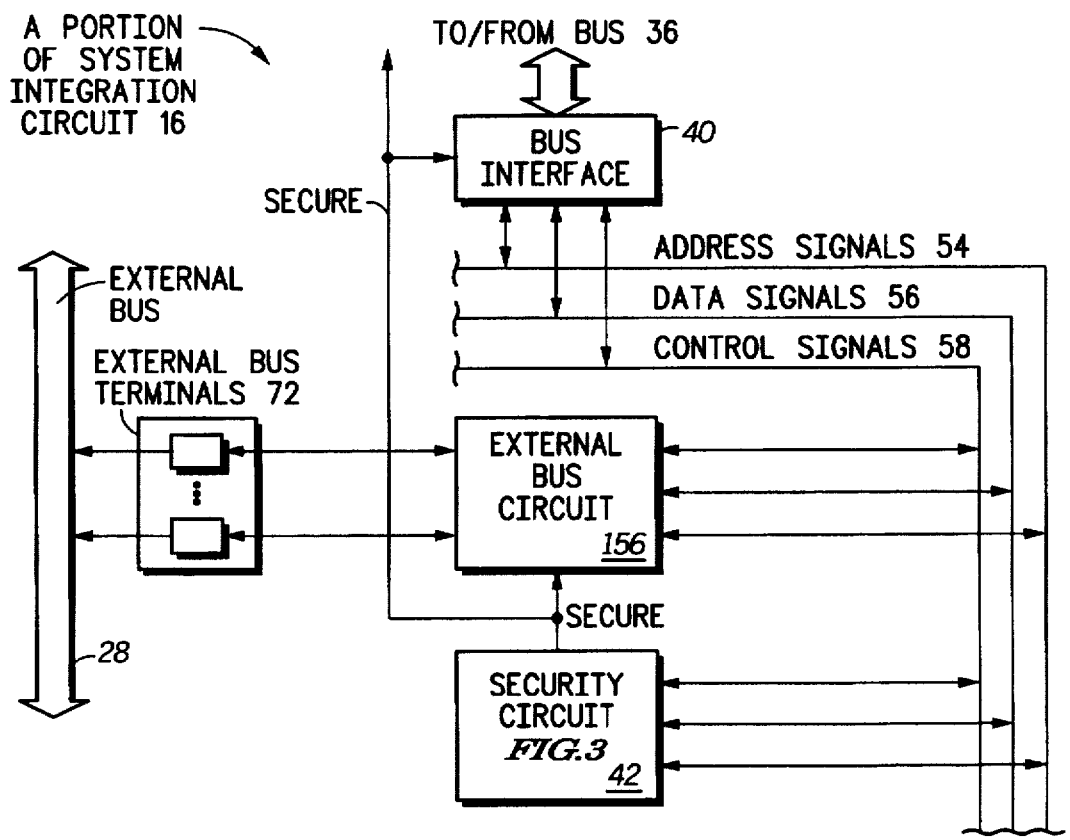
FIG. 2 illustrates in block diagram form a system integration circuit of FIG. 1.

FIG. 2 illustrates a portion of system integration circuit 16. The portion of system integration circuit 16 illustrated therein includes a bus interface 40, an external bus circuit 156, a security circuit 42, and a plurality of external bus terminals 72. Bus interface 40 is coupled to bus 36. Furthermore, each of bus interface 40, external bus circuit 156, and security circuit 42 is bidirectional coupled to an Address Signals bus 54, a Data Signals bus 56, and a Control Signals bus 58. External bus circuit 156 is coupled to the plurality of external bus terminals 72 to communicate external information. Each of the plurality of external bus terminals 72 is coupled to External Bus 28. Security circuit 42 is coupled to both external bus circuit 156 and bus interface 40 to provide a Secure signal. Security circuit 42 also provides the Secure signal to a remaining portion of data processing system 10 illustrated in FIG. 1.

Figure 3:
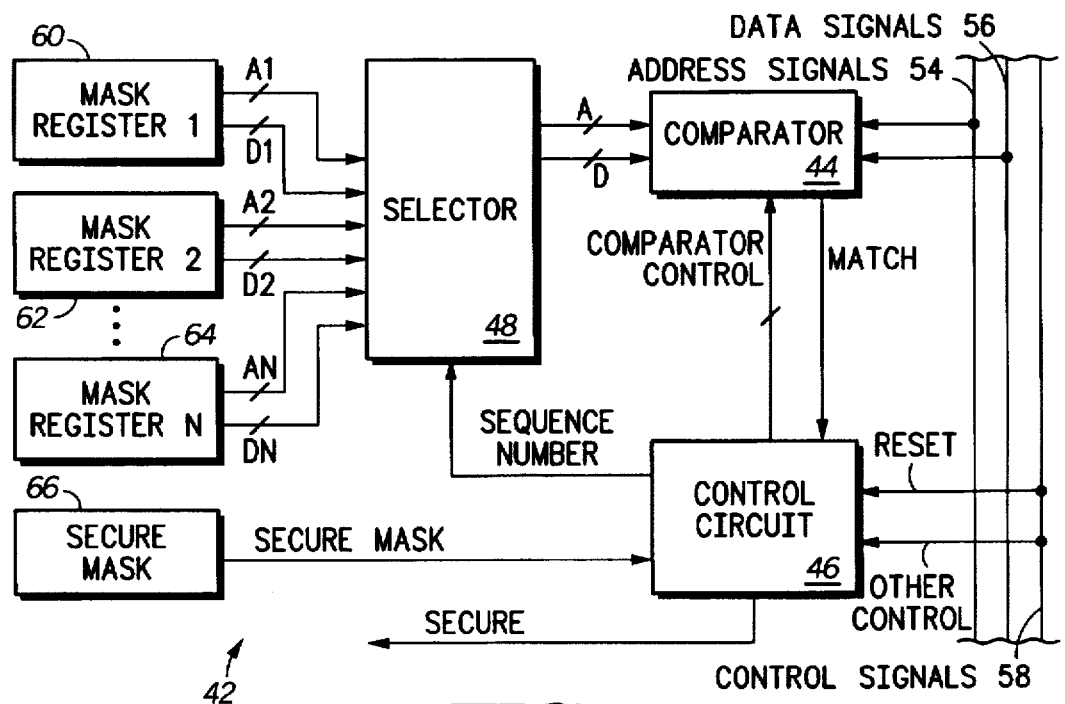
FIG. 3 illustrates in block diagram form a security circuit of FIG. 2.

FIG. 3 illustrates a portion of security circuit 42. The portion of security circuit 42 includes a comparator 44, a control circuit 46, a selector 48, a mask register 1 60, a mask register 2 62, a mask register N 64, and a secure mask 66. Comparator 44 is coupled to Address signals bus 54 and Data signals bus 56. Control circuit 46 is coupled to Control signals bus 58 to receive a Reset signal and a plurality of Other Control signals. Comparator 44 is coupled to control circuit 46 to transfer a Match signal and to receive a plurality of Comparator Control signals. Comparator 44 is also coupled to selector 48 to receive a plurality of A signals and a plurality of D signals. Control circuit 46 is coupled to selector 48 to provide a Sequence Number signal, which transfers a number, N, to selector 48. Control circuit 46 is coupled to secure mask 66 to receive a Secure Mask signal. Furthermore, control circuit 46 provides the Secure signal. Mask register 1 60 is coupled to selector 48 to provide a plurality of A1 signals and a plurality of D1 signals. Mask register 2 62 is coupled to selector 48 to provide a plurality of A2 signals and a plurality of D2 signals. Lastly, mask register N 64 is coupled to selector 48 to provide a plurality of AN signals and a plurality of DN signals. It should be noted that more registers may be included between mask register 2 62 and mask register N 64, but were not illustrated in FIG. 3 for the sake of clarity.

Detailed Description of Operation

A security feature and a data processing system and method for disabling the security feature will now be described in more detail. In the present invention, information is transferred between each of the components of data processing system 10 via Bus 36. External information is transferred via a plurality of integrated circuit pins 24, 25, 28, 30, 32, 34, and 35.

In a master mode of operation, CPU 12 controls operation of each of timer circuit 14, system integration circuit 16, serial circuit 18, A/D converter circuit 20, SRAM 22, and non-volatile memory 23 via a plurality address, data, and control signals transferred via Bus 36. CPU 12 executes each of the instructions required during operation of data processing system 10. Bus 36 communicates information between CPU 12 and a remaining portion of data processing system 10. In a slave mode of operation, External Bus 28 controls external bus circuit 156 via the plurality of bus terminals 72. External bus circuit 156 controls bus interface circuit 40 via Address Signals bus 54, Data Signals bus 56, and Control Signals bus 58. Bus interface circuit 40 then controls operation of CPU 12, timer circuit 14, serial circuit 18, A/D converter circuit 20, SRAM 22, and non-volatile memory 23

During operation of data processing system 10, timer 14 provides timing control and interrupt features between data processing system 10 and an external device via the plurality of integrated circuit pins 26 when such communication is not restricted by timer security buffer 15. The timing control and interrupt features are generally well known in the data processing art and will not be discussed in further detail. Serial circuit 18 communicates serial data between data processing system 10 and an external device via the plurality of integrated circuit pins 30 when such communication is not restricted by serial security buffer 17. A/D converter 20 executes analog to digital conversion operations in response to data provided by an external source via the plurality of external integrated circuit pins 32 when such data is not restricted by A/D security buffer 19. SRAM 22 and non-volatile memory 23 both provide memory storage for functions executed during operation of data processing system 10. It should be noted that the sequence of key bytes used to provide security for data processing system 10 may be stored in non-volatile memory 22 or a nonvolatile memory embedded in another module of data processing system 10. System integration circuit 16 allows interaction between data processing system 10 and a plurality of other external devices.

A portion of system integration circuit 16, illustrated in more detail in FIG. 2, determines when data processing system 10 is operating in a secure mode of operation. Bus interface 40 communicates data, address, and control information from a remaining portion of data processing system 10 via Bus 36. Bus interface 40 communicates address values via Address Signals bus 54, data values via Data Signals bus 56, and control values via Control Signals bus 58. Similarly, external bus circuit 156 communicates address values via Address Signals bus 54, data values via Data Signals bus 56, and control values via Control Signals bus 58 with the plurality of external bus terminals 72. Security circuit 42 asserts or negates the Secure signal after monitoring the address values on Address Signals bus 54, the data values on Data Signals bus 56 and the control values on Control Signals bus 58.

When the Secure signal is asserted, the security mode is enabled. When the security mode is enabled and data processing system 10 is operating in a slave mode of operation, all external reads of internal memory and registers are disabled by the external bus circuit 156. Slave reads, which transfer data values provided by Data Signals bus 56 to the plurality of external bus terminals 72 and eventually an external device, are blocked by external bus circuitry 156. Additionally, external indications of internal activities, such as those provided by "show" cycles, are also blocked by external bus circuit 156. Again, in the case of show cycles, data values provided by Data Signals bus 56 are not transferred to the plurality of external bus terminals 72 and are blocked by external bus circuit 156. Similarly, when data processing system 10 is operating in a background debug mode of operation in which data is transferred between the plurality of integrated circuit pins 24 and CPU 12 and between the plurality of integrated circuit pins 28 and system integration circuit 16, the data values transferred between CPU 12 and the plurality of integrated circuit pins 24 is blocked by CPU security buffer 13 and the data values transferred between the plurality of integrated circuit pins 28 and system integration circuit 16 are also blocked by external bus circuit 156.

Furthermore, when the Secure signal is asserted and the security mode of operation is enabled, a transfer of information between CPU 12, timer circuit 14, system integration circuit 16, serial circuit 18, AD converter circuit 20, SRAM 22, and nonvolatile memory 23 and the external world is restricted. When asserted, the Secure signal enables CPU security buffer 13 to restrict the transfer of information between CPU 12 and an external user via the plurality of integrated circuit pins 24, timer security buffer 15 to restrict the transfer of information between timer 14 and an external user via the plurality of integrated circuit pins 26, and serial security buffer 17 to restrict the transfer of information between serial circuit 18 and an external user via the plurality of integrated circuit pins 30. Similarly, when asserted, the Secure signal enables A/D security buffer 19 to restrict the transfer of information between A/D converter circuit 20 and an external user via the plurality of integrated circuit pins 32, SRAM security buffer 21 to restrict the transfer of information between SRAM 22 and an external user via the plurality of integrated circuit pins 34, and memory security buffer 24 to restrict the transfer of information between nonvolatile memory 23 and an external user via the plurality of integrated circuit pins 35. Additionally, when bus interface 40 receives addresses indicating a boot mode of operation or a first instruction fetch, bus interface 40 indicates to a nonvolatile memory embedded within data processing system 10, such as nonvolatile memory 23, to respond thereto with information via Bus 36. When the secure mode of operation is enabled, external bus circuit 156 restricts access from External Bus 28 and bus interface 40 is able to receive information provided by the nonvolatile memory on Bus 36.

When the Secure signal is negated, the security mode of operation is disabled. When the security mode of operation is disabled, external reads of internal memory and registers are not blocked by external bus circuitry 156. When the Secure signal is negated, an external indication of internal activities, such as "show" cycles, are not blocked by external bus circuit 156. Additionally, during the background debug mode of operation, communication between an external device (not shown herein) and CPU 12 via the plurality of integrated circuit pins 24 and CPU security buffer 13 is not disabled.

Security circuit 42, illustrated in more detail in FIG. 3, provides the Secure signal in either an asserted or a negated logic state. The state of the Secure signal is determined by a value stored in secure mask 66 during a reset operation in which data processing system 10 is initialized for operation and the Reset signal is asserted. The value stored in secure mask 66 is built into mask 66 during a fabrication phase of data processing system 10.

If the Secure Mask signal is asserted the control circuitry 46 sets a value of "N" to a first value and transfers that value, N, via the Sequence Number signal. The value of N is subsequently provided to selector 48. Selector 48 selects mask register 1 60 to receive signals A1 and signals D1, therefrom. Selector 48 then transfers the A1 and D1 values to comparator 44 via the A signal and the D signal, respectively. In other embodiments of the present invention, selector 48 may set a state of the A and D signals to inverted values of the A1 and D1 signals, respectively. The value stored in mask registers 60, 62, and 64 is built into the mask registers during a fabrication phase of data processing system 10. It should be noted that a mask register may be fabricated with different values for different external users. Furthermore, the values stored in a mask register can not be read or altered externally.

During operation of data processing system 10, control circuitry 46 monitors the control values transferred via Control Signals bus 58. When an appropriate control value, such as a write control signal or an appropriate timing signal, is received via the Other Control signals, control circuit 46 provides the plurality of Comparator Control signals to comparator 44. The plurality of Comparator Control signals comparator 44 to compare the A signal having multiple bits to an address value transferred via Address Signals bus 54 and to compare the D signal having multiple bits to a data value transferred via Data Signals bus 56.

Comparator 44 asserts a Match signal if the A signal corresponds to the address value transferred via Address Signals bus 54 and if the D signal corresponds to the data value transferred via Data Signals bus 56. In one embodiment of the present invention, the correspondence between the A signal and the Address value transferred via Address Signals bus 54 and the correspondence between the D signal and the data value transferred via Data Signals bus 56 is equality. In other embodiments of the present invention, only the correspondence between the A signal and the Address value transferred via Address Signals bus 54, or the correspondence between the D signal and the data value transferred via Data Signals bus 56 may be determined.

When the correspondence between the A signal and the Address value transferred via Address Signals bus 54 and the correspondence between the D signal and the data value transferred via Data Signals bus 56 is determined, control circuit 46 receives the Match signal. If the Match signal is negated, control circuit 46 sets the value of the Sequence Number signal to the first value, or the initial value. If the Match signal is asserted, control circuit 46 sets the value of "N" transferred by the Sequence Number signal to a next value. If the value of "N" corresponds to a last value "M", control circuit 46 negates the Secure signal. If the value of "N" does not correspond to the last value "M", selector 48 selects a next set of mask registers (62, . . . 64), and transfers their value to signals A and D, respectively. It should be noted that in the preferred embodiment, the correspondence between N and M is "N" greater than "M".

Figure 4:
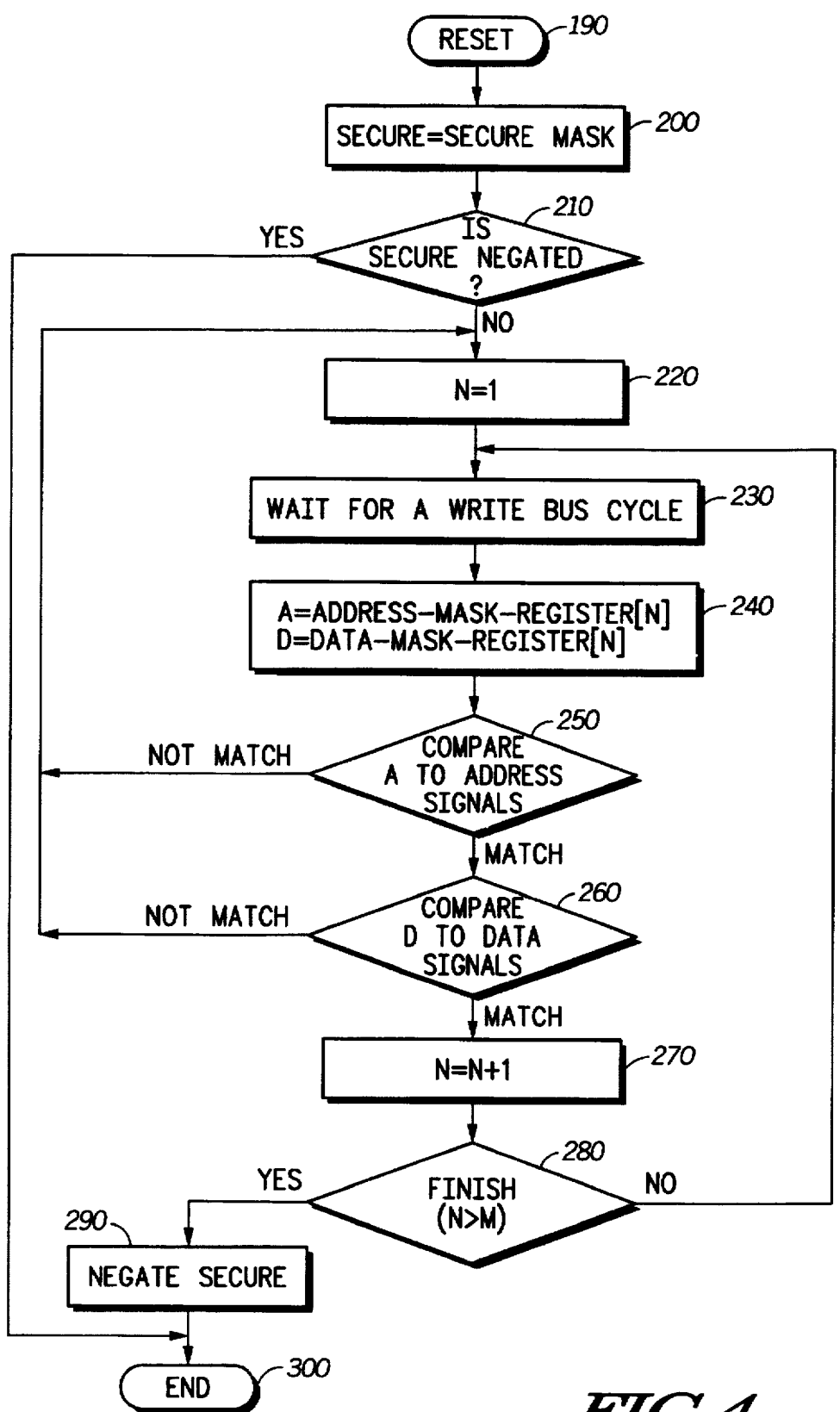
FIG. 4 illustrates in flow chart form a method for disabling a security mode for protecting information stored in an internal memory of a data processor.

The process of receiving and comparing the A and D signals is repeated until the Secure signal is negated. FIG. 4 provides a flow chart for illustrating the steps which must be executed to disable data processing system 10 from operating in the secure mode of operation.

As illustrated in FIG. 4, step 190, the Reset signal is asserted during a reset operation. It should be noted that in the implementation of the invention described herein, the Reset signal is a power on reset signal. When the Reset signal is asserted, secure mask 66 provides a Secure Mask signal to control circuit 46 (step 200). Control circuit 46 provides the Secure signal in response to a value of the Secure Mask signal. It should be noted that the Secure signal is equal to the value of the Secure Mask signal in this embodiment of the invention. However, in alternate embodiments of the invention, the Secure signal may be a complement of the value of the Secure Mask signal or related to the value of the Secure Mask signal through another function. The Secure signal is then tested to determine whether or not data processing system 10 is operating in a secure mode of operation (step 210). If the Secure signal is negated, a security mode of operation in data processing system 10 is disabled, and the method for disabling the security mode of operation is finished (step 300).

If the Secure signal is asserted, data processing system 10 is functioning in an enabled security mode of operation. If the Secure signal is asserted, control circuit 46 provides a first value of "N" to selector 48 (step 220). Data processing system 10 waits for a write bus cycle to be subsequently performed (step 230). In another embodiment, control circuit 46 may wait for any bus cycle, for a read bus cycle, or for any other type of specific bus cycle.

When N=1, selector 48 selects an address value, A1, from mask register 1 as the A value (step 240). Also, when N=1, selector 48 selects a data value, D1, from mask register 1 as the D value (step 240). In step 250, the A value provided by selector 48 is compared to an address value provided by Address Signals bus 54 in comparator 44. If the values are not equal, the execution flow of data processing system 10 is returned to step 220. As long as the values are not equal, data processing system 10 remains in a secure mode of operation and internal memory may not be accessed by an external source. If the values match, the D value provided by selector 48 is compared to a data value provided by Data Signals bus 56 in comparator 44 (step 260). If the values do not match, the execution flow of data processing system 10 is returned to step 220.

If the values match, comparator 44 increments N by one (step 270). The loop from steps 230 to 280 is repeated until N is greater than another value "M". When "N" is greater than "M", the control circuit 46 negates the Secure signal (step 290) and the operation is complete (step 300). Furthermore, each time N is incremented and the loop is repeated, a mask register corresponding to a current value of N is accessed. For example, when N equals two, mask register 2 62 is accessed for providing the values of A2 and D2 as the address and data values on the A and D signals, respectively.

In summary, the present invention provides a system and method by which only an authorized user may unlock the security code on a data processor, even if the data processor supports slave mode, a debug mode of operation, or a direct access of any of the modules by an external user. This is a feature not found in other prior art solutions as they did not support slave mode, a debug mode of operation, or a direct access of any of the modules by an external user. Furthermore, the data processor and method described herein may be used with any nonvolatile memory, including a ROM type memory, because the data processor and method does not require a writable non-volatile memory bit, as in the prior art implementations. The system and method described herein also allows unlocking the data processor for testing and debugging purposes. Furthermore, although the present system and method described herein provides a very complex obstacle to access by unauthorized users, the system and method may be easily implemented on silicon.

The present invention performs each of the functions described above by providing a method to secure internal data in an internal memory, while allowing access by an authorized user. An unlocking code, or a sequence, to disable a secured mode of operation, is designed to avoid access by an unauthorized user by utilizing a very large number of possible combinations. If, however, an authorized user knows the unlocking sequence, access for testing and debugging purposes is easily provided.

In the implementation of the invention described herein, an attempt to unlock the secured mode by randomly generating an "opening sequence", or by trying all possible combinations, will take an average of more than 10,000 years, at a fastest possible computing speed. Additionally, this invention provides a method to adjust a number of possible combinations to provide added security. In a first embodiment, the present invention may be implemented with a single mask programmable ROM memory layer which easily provides a different unlocking sequence to disable the security mode in a data processor for various users.

The implementation of the invention described herein is provided by way of example only. However, many other implementations may exist for executing the function described herein. For example, in other embodiments, control circuitry 46 may set the state of the secure signal to the inverted value of the secure mask 66. Additionally, both address and data values do not have to be compared. In some implementations, only address lines, only data lines, only control lines, or some combination of address, data, and control lines may be compared with stored values. Additionally, non-volatile memory 23 may be a memory other than ROM, such as EPROM, EEPROM, a flash memory, or a hard-wired implementation.

Additionally, a secure mode of operation may be always enabled out of reset such that no secure mask is required. Additionally, read cycles only, a combination of read and write cycles, or any type of specific bus cycle may be used to unlock the secured mode. In the implementation described in detail herein, only write cycles were used.

Furthermore, an order of comparison for address and data information may be modified to have any order desired by a designer. Address and data information may even be compared concurrently. Additionally, trying to unlock the secured mode in the preferred embodiment by randomly generating an "opening sequence", or trying all possible combinations, will take an average of more than 10,000 years, at the fastest possible operating frequency. In another embodiment, this invention may be modified to require additional mask registers and, therefore, to easily provide added security simply by adjusting a number of possible combinations. As well, the invention may be modified to provide fewer mask registers for circuits which are unable to support the overhead costs associated with the additional circuitry. Additionally, a number of address and data bits stored in the mask registers may be increased or decreased to respectively provided added or diminished security capability.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A method for providing security for a data processor, comprising the steps of:
   i. receiving a plurality of signals using a bus interface circuit;
   ii. retrieving a first stored address value from a first one of a plurality of mask registers;
   iii. retrieving a first stored data value from the first one of the plurality of mask registers;

iv. comparing the first stored address value with a first address value of the plurality of signals;

v. comparing the first stored data value with a first data value of the plurality of signals;

vi. asserting a first match signal when the first stored address value is equal to the first address value of the plurality of signals and when the first stored data value is equal to the first data value of the plurality of signals;

vii. executing step ii. when one of the first stored address value is not equal to the first address value of the plurality of signals and the first stored data value is not equal to the first data value of the plurality of signals;

viii. negating a secure signal when the first match signal is asserted;

ix. retrieving a next stored address value from a next one of the plurality of mask registers;

x. retrieving a next stored data value from the next one of the plurality of mask registers;

xi. comparing the next stored address value with a next address value of the plurality of signals;

xii. comparing the next stored data value with a next data value of the plurality of signals;

xiii. asserting a next match signal when the next stored address value is equal to the next address value of the plurality of signals, when the next stored data value is equal to the next data value of the plurality of signals, and when a previous match signal was asserted;

xi. executing step ii. when one of the next stored address value is not equal to the next address value of the plurality of signals and the next stored data value is not equal to the next data value of the plurality of signals;

xv. executing steps x. through xv. for a predetermined number of repetitions; and xvi. negating the secure signal when the first match signal is asserted and when each of a plurality of next match signals is asserted.

2. The method of claim 1 wherein the predetermined number of repetitions is equal to a number of the plurality of mask registers.

* * * * *